(12) United States Patent
Takeda

(10) Patent No.: US 7,046,092 B2
(45) Date of Patent: May 16, 2006

(54) AMPLIFIER CIRCUIT HAVING SIGNAL DETECTION FUNCTION

(75) Inventor: Noriaki Takeda, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 65 days.

(21) Appl. No.: 10/861,463

(22) Filed: Jun. 7, 2004

(65) Prior Publication Data
US 2005/0012549 A1    Jan. 20, 2005

(30) Foreign Application Priority Data
Jul. 16, 2003  (JP) ............................ 2003-275073

(51) Int. Cl.
*H03F 3/08* (2006.01)
(52) U.S. Cl. ....................... 330/308; 330/140
(58) Field of Classification Search ................ 330/140, 330/308, 133, 141; 398/210; 250/214 A
See application file for complete search history.

(56) References Cited

U.S. PATENT DOCUMENTS 6,549,068 B1 *  4/2003  Bollenbeck .................. 330/129
6,556,330 B1    4/2003  Holcombe

* cited by examiner

*Primary Examiner*—Steven J. Mottola
(74) *Attorney, Agent, or Firm*—McDermott Will & Emery LLP

(57) ABSTRACT

In an amplifier circuit, a main amplification section includes an amplifier for amplifying an input signal and a reference voltage generation circuit for generating a reference voltage from an output signal of the amplifier. Other main amplification sections each including the same internal structure are cascade-connected. A switch is provided for selecting any of amplifier outputs of these main amplification sections. A frequency component lower than that of an input signal to the amplifier circuit is removed by a filter circuit, and thereafter, the presence/absence of an input signal is detected by an amplitude detection circuit and a comparator. With such a structure, even if the input signal abruptly changes, e.g., immediately after the start of communication or immediately after the end of communication, an optical signal input is correctly detected and reproduced.

16 Claims, 4 Drawing Sheets

AMPLIFIER CIRCUIT HAVING SIGNAL DETECTION FUNCTION

BACKGROUND OF THE INVENTION

The present invention relates to an amplifier circuit having a signal detection function, which is preferably used in an optical receiver.

In an optical receiver used in an optical communication system, an optical signal from an optical fiber is converted to an electric current by a photodiode and then converted to a voltage signal by a transimpedance amplifier. However, this voltage signal is very small in the vicinity of a minimum light reception level of an optical input and therefore needs to be amplified by an amplifier circuit.

The first conventional technique employs a feed-forward amplifier circuit including a first-stage amplifier for amplifying a very small signal and a capacitor-retained reference voltage generation circuit for generating a reference voltage according to an output signal of the first-stage amplifier and retaining the reference voltage in a capacitor. This feed-forward amplifier circuit has a structure wherein an output of the reference voltage generation circuit is input to an amplifier of the next stage as a reference voltage (see M. Nakamura et al., "An Instantaneous Response CMOS Optical Receiver IC with Wide Dynamic Range and Extremely High Sensitivity Using Feed-Forward Auto-Bias Adjustment", IEEE Journal of Solid-State Circuits, Vol. 30, No. 9, pp. 991–997, September 1995).

On the other hand, an amplifier circuit having a signal detection function which notifies about the presence/absence of an optical signal input has been known. A signal detection circuit of this amplifier circuit includes an amplitude detection circuit for detecting an output amplitude of an amplifier and a comparator for comparing an output signal of the amplitude detection circuit and a predetermined reference voltage.

In general, an amplifier in an optical detector has a large gain, and therefore, large noise is sometimes caused in an amplifier output, for example, when no signal is input to the amplifier. In view of such, according to the second conventional technique, a variation that occurs in a comparator output of a signal detection circuit is masked by a monostable multivibrator and an AND gate such that an effect of impulse noise, which occurs in an amplifier output when no optical signal is input or when an optical signal input abruptly changes, is eliminated to prevent a malfunction of the signal detection circuit (Japanese Unexamined Patent Publication No. 5-191354). According to the third conventional technique, a variation that occurs in a comparator output of a signal detection circuit is masked by a delay circuit and an AND gate (Japanese Unexamined Patent Publication No. 10-112689).

Assuming that an amplifier circuit having a signal detection function which is obtained by combining the first conventional technique and the second or third conventional technique is provided, an output signal of an amplifier which receives an output of a reference voltage generation circuit is supplied to a signal detection circuit, and a variation which occurs in a comparator output of the signal detection circuit is masked by a monostable multivibrator or delay circuit and an AND gate.

However, in the case where a signal input to the amplifier circuit abruptly changes, e.g., immediately after the start of inputting of an optical signal or immediately after the stoppage of inputting of the optical signal, a transient response of a low frequency occurs in the output voltage of the reference voltage generation circuit. This transient response has a frequency lower than that of an original signal component, and a long time period is spent until a convergence of the variation. Thus, in order to prevent an adverse effect of the transient response on a signal detection result, the time period for masking a variation that occurs in the comparator output of the signal detection circuit needs to be set to be long beforehand and adjusted at an optimum time. This structure is disadvantageous in integration and size reduction.

SUMMARY OF THE INVENTION

The present invention was conceived in view of the above problems. An objective of the present invention is to provide an amplifier circuit having a signal detection function, which has a structure that prevents a malfunction of a signal detection circuit due to the effect of a transient response of a reference voltage generation circuit and is advantageous in integration and size reduction.

In order to achieve the above objective, the first amplifier circuit of the present invention has a structure comprising: a main amplification section which includes an amplifier for amplifying an input signal and a reference voltage generation circuit for generating a reference voltage from an output of the amplifier; a filter circuit for removing a frequency component lower than that of the input signal, the filter circuit being connected to an output of the amplifier; an amplitude detection circuit connected to an output of the filter circuit; and a comparator for comparing an output signal of the amplitude detection circuit with a predetermined reference voltage.

The second amplifier circuit of the present invention has a structure comprising: a main amplification section which includes a differential-output amplifier for amplifying an input signal to output a differential signal and a reference voltage generation circuit for generating a reference voltage from at least one of signals that constitute a differential output of the amplifier; first and second filter circuits for removing a frequency component lower than that of the input signal, the first and second filter circuits being connected to the differential output of the amplifier; an amplitude detection circuit connected to outputs of the first and second filter circuits; and a comparator for comparing an output signal of the amplitude detection circuit with a predetermined reference voltage.

According to the present invention, it is possible to correctly detect a signal without the influence of a transient response of a reference voltage generation circuit which is caused when the input state changes.

DESCRIPTION OF THE PREFERRED EMBODIMENTS

Hereinafter, embodiments of the present invention are described in detail with reference to the drawings.

Figure 1:
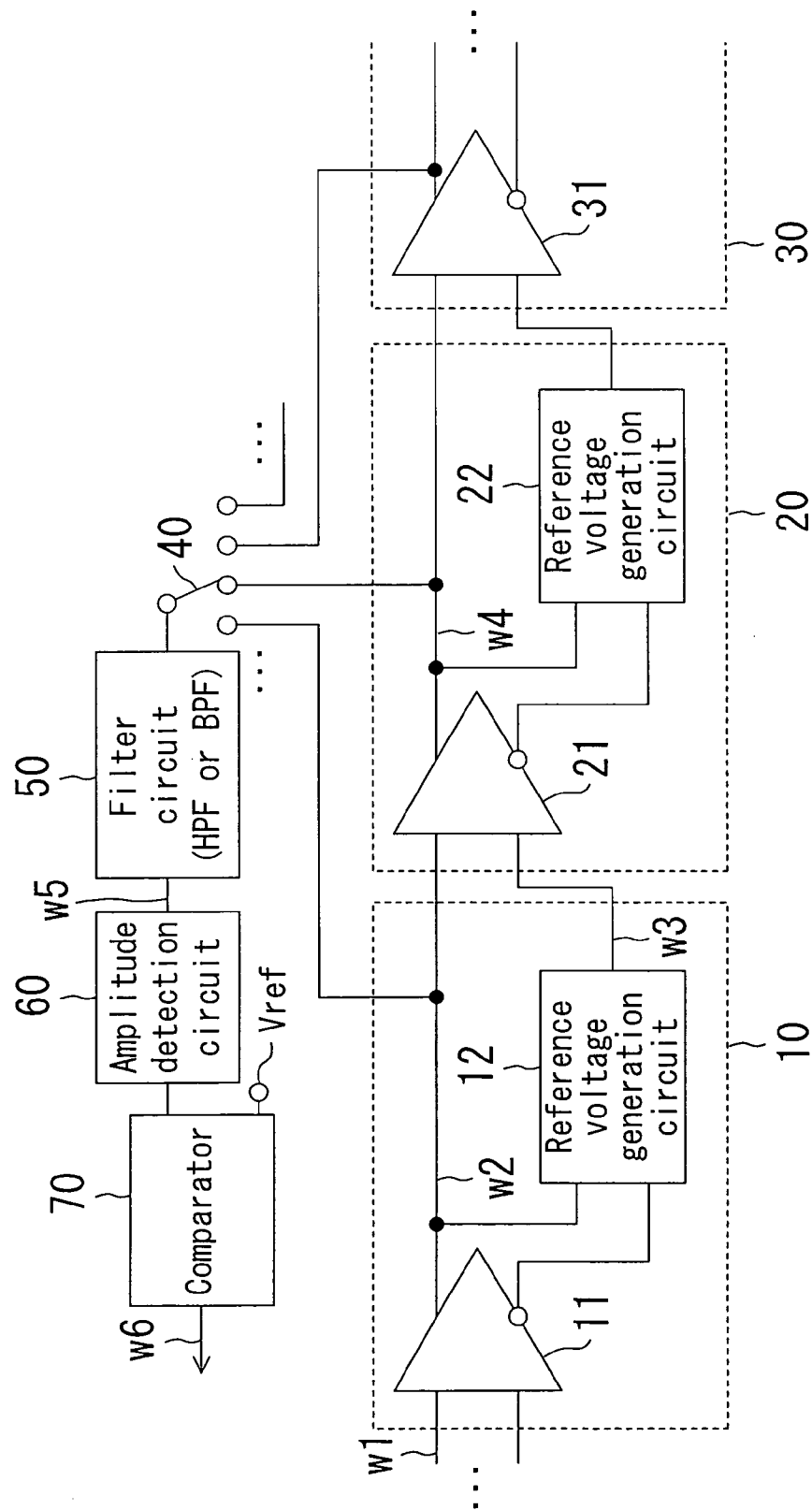
FIG. 1 is a block diagram showing an example of the structure of an amplifier circuit according to the present invention.

FIG. 1 shows an example of the structure of an amplifier circuit according to the present invention. The amplifier circuit of FIG. 1 is a multi-stage amplifier circuit which is used in an optical receiver. The amplifier circuit includes a plurality of main amplification sections 10, 20 and 30 which are cascade-connected. The first main amplification section 10 includes a differential-output amplifier 11 and a reference voltage generation circuit 12 for generating a reference voltage from at least one of differential outputs of the amplifier 11 and retaining the reference voltage in a capacitor. The second main amplification section 20 includes a differential input/output amplifier 21 which receives an output of the first main amplification section 10 and a reference voltage generation circuit 22 for generating a reference voltage from at least one of differential outputs of the amplifier 21. Reference numeral 31 denotes an amplifier of the third main amplification section 30. One of the differential outputs of the amplifier 11 of the first main amplification section 10 and the output of the reference voltage generation circuit 12 are connected to the input terminals of the amplifier 21 of the second main amplification section 20. One of the differential outputs of the amplifier 21 of the second main amplification section 20 and the output of the reference voltage generation circuit 22 are connected to the input terminals of the amplifier 31 of the third main amplification section 30.

The amplifier circuit of FIG. 1 further includes a switch 40, a filter circuit 50, an amplitude detection circuit 60 and a comparator 70. The switch 40 selects any of the outputs of the main amplification sections 10, 20 and 30 and connects the selected output to the filter circuit 50. The filter circuit 50 has a high pass filter (HPF) or band pass filter (BPF) characteristic such that a frequency component lower than that of a signal input to the amplifier circuit is removed. The amplitude detection circuit 60 is a circuit for detecting the amplitude of an amplifier output which has passed through the filter circuit 50. The comparator 70 compares an output signal of the amplitude detection circuit 60 with predetermined reference voltage Vref to output a result of the comparison as a detection signal for an optical signal.

Figure 2:
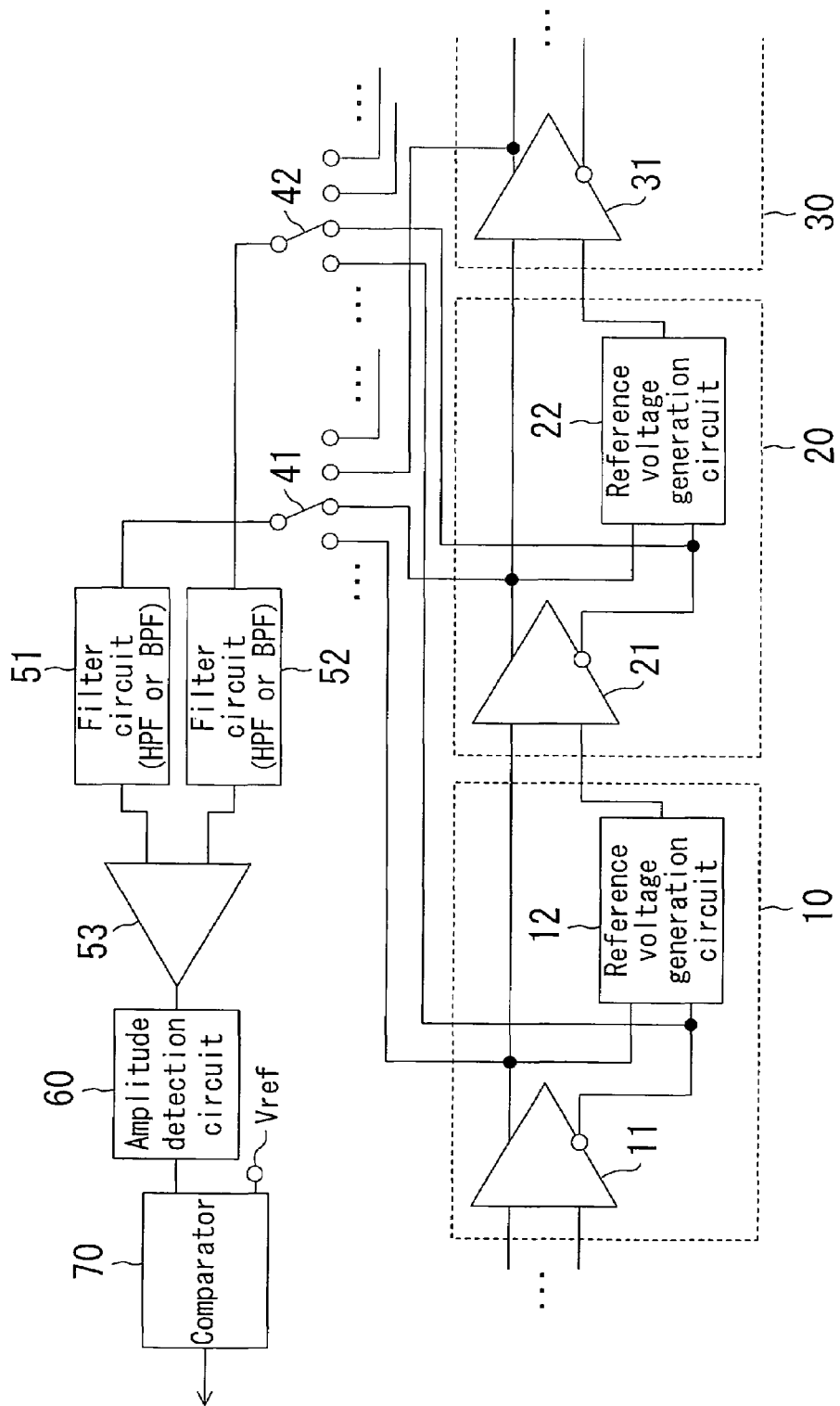
FIG. 2 is a block diagram showing another example of the structure of the amplifier circuit according to the present invention.

FIG. 2 shows another example of the structure of an amplifier circuit according to the present invention. The amplifier circuit of FIG. 2 includes first and second switches 41 and 42, first and second filter circuits 51 and 52, a differential-single conversion circuit 53, an amplitude detection circuit 60 and a comparator 70 in addition to the plurality of main amplification sections 10, 20 and 30 of FIG. 1. The first and second switches 41 and 42 select any of the main amplification sections 10, 20 and 30 and connects the differential output of an amplifier of the selected main amplification section (e.g., the amplifier 21) to the first and second filter circuits 51 and 52. The first and second filter circuits 51 and 52 each have a high pass filter (HPF) or band pass filter (BPF) characteristic such that a frequency component lower than that of a signal input to the amplifier circuit is removed. The differential-single conversion circuit 53 converts a differential signal formed by the outputs of the first and second filter circuits 51 and 52 to a single end signal. The amplitude detection circuit 60 is a circuit for detecting the amplitude of an amplifier output which has passed through the first and second filter circuits 51 and 52 and the differential-single conversion circuit 53. The comparator 70 compares an output signal of the amplitude detection circuit 60 with predetermined reference voltage Vref to output a result of the comparison as a detection signal for an optical signal.

Figure 3:
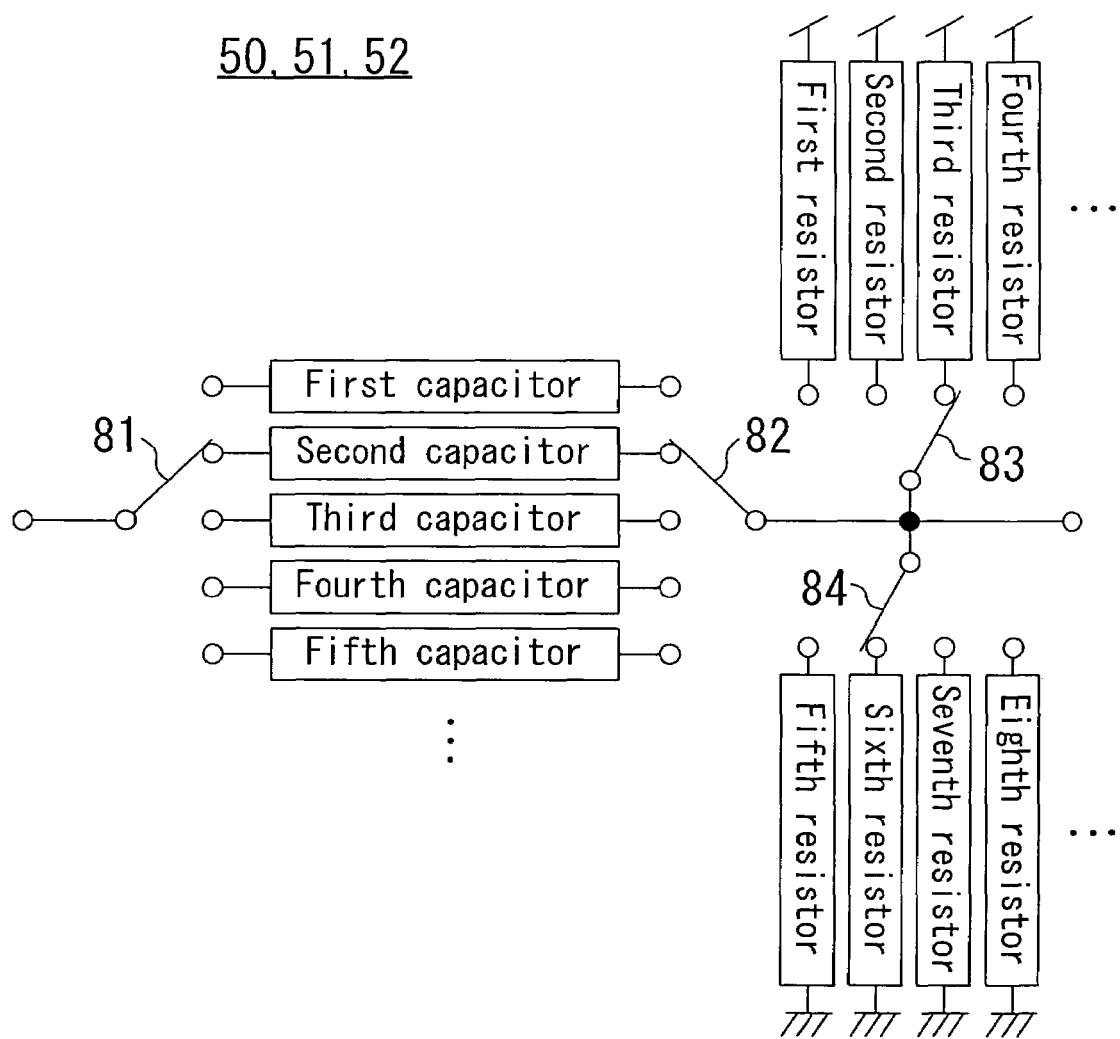
FIG. 3 is a circuit diagram showing an example of the structure of a filter circuit in FIGS. 1 and 2.

FIG. 3 shows an example of the structure of the filter circuits 50, 51 and 52 in FIGS. 1 and 2. The example of FIG. 3 is a HPF having the function of changing the signal band through which a signal is allowed to pass. Specifically, connections of capacitors and resistors are switched by switches 81 to 84 to change the circuit constants (capacitance value and resistance value), whereby the band of the filter circuit is adjusted. With this structure, the signal pass band is flexibly adjusted according to the communication speed. It should be noted that it is also possible to provide a band adjustment function to a BPF.

Figure 4:
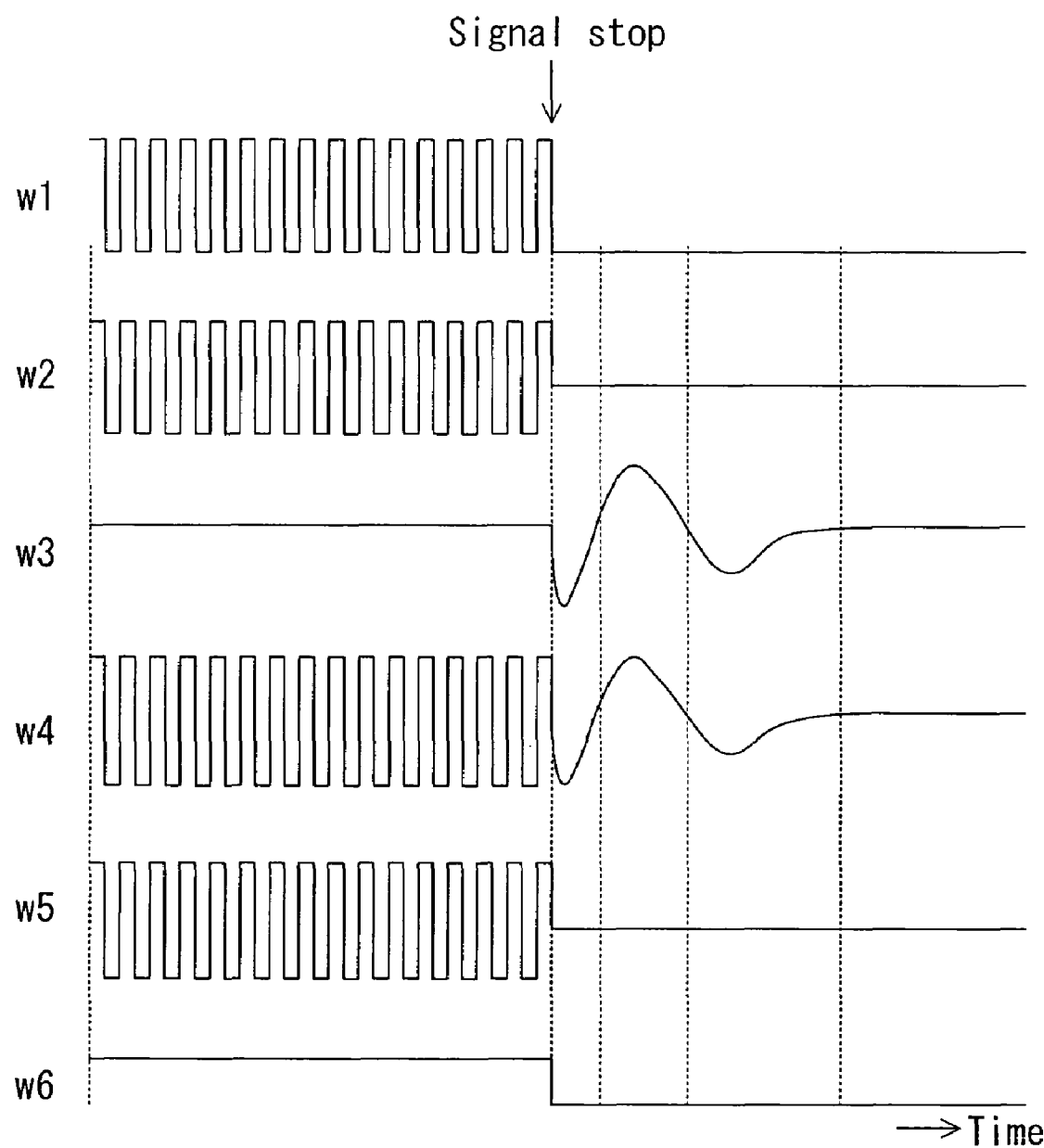
FIG. 4 shows signal waveforms at various positions in FIG. 1.

FIG. 4 shows signal waveforms at positions w1 to w6 in FIG. 1 when inputting of an optical signal is stopped. It is assumed herein that the second main amplification section 20 is selected by the switch 40.

According to FIG. 4, when inputting of signal w1 to the first main amplification section 10 is stopped, the output signal of the amplifier 11 is stopped in response to the stop of signal w1. Herein, output signal w3 of the reference voltage generation circuit 12 exhibits a transient response which has a frequency component lower than that of signal w1. This transient response component is input to the amplifier 21 at the next stage, and therefore, output signal w4 of the amplifier 21 includes a transient response component which is not included in signal w1. However, the transient response component included in signal w4 is removed by the filter circuit 50, and as a result, signal w5 which does not include a transient response component is supplied to the amplitude detection circuit 60. Thus, the comparator 70 outputs correct detection signal w6 without the influence of the transient response component.

As described above, in the structure of FIG. 1, a signal is correctly detected without the influence of the transient response of the reference voltage generation circuits 12 and 22 which occurs when the input state changes. Further, in the structure of FIG. 2, the amplitude is detected from a differential signal, whereby it is possible to correctly perform signal detection without the influence of noise even in a smaller signal.

The level of an optical signal in an optical receiver largely varies according to the conditions for use, for example, the distance between a transmitter and a receiver, and the like. Thus, it is desirable that the level at which an amplifier circuit can detect an input signal can be set over a wide range. In general, the amplitude range which can be detected by the amplitude detection circuit 60 has both an upper limit and a lower limit. In the case where the level of detecting an input signal is adjusted, it is impossible to correctly detect the signal at a level out of this range. In view of such, as shown in FIGS. 1 and 2, the amplification stage for detecting the amplitude is selected according to the input level, such that the output of an amplifier at a later stage is selected in the case of a low input level, and the output of an amplifier at an earlier stage is selected in the case of a high input level, whereby signal detection is achieved over a wide input range.

It should be noted that if a BPF is used as the filter circuits 50, 51 and 52, not only a transient response component of a low frequency but also a high frequency noise component is removed. Thus, amplitude detection is achieved more correctly, and the accuracy of signal detection is improved.

As described above, an amplifier circuit having a signal detection function according to the present invention has a structure advantageous in integration and size reduction and is useful as an optical receiver, or the like.

What is claimed is:

1. An amplifier circuit, comprising:
    a main amplification section which includes an amplifier for amplifying an input signal and a reference voltage generation circuit for generating a reference voltage from an output of the amplifier;
    a filter circuit for removing a frequency component lower than that of the input signal, the filter circuit being connected to an output of the amplifier;
    an amplitude detection circuit connected to an output of the filter circuit; and
    a comparator for comparing an output signal of the amplitude detection circuit with a predetermined reference voltage, wherein:
    the amplifier circuit has a multi-stage structure including a plurality of said main amplification sections which are cascade-connected; and
    the amplifier circuit further includes a switch for selecting any of outputs of amplifiers of the plurality of main amplification sections to connect the selected output to the filter circuit.

2. The amplifier circuit of claim 1, wherein the filter circuit is a high pass filter.

3. The amplifier circuit of claim 1, wherein the filter circuit is a band pass filter.

4. The amplifier circuit of claim 1, wherein the filter circuit has the function of changing a signal band through which a signal is allowed to pass.

5. The amplifier circuit of claim 4, wherein a resistance value and a capacitance value of the filter circuit are adjustable by switching connections of resistors and capacitors included in the filter circuit.

6. An amplifier circuit, comprising:
    a main amplification section which includes a differential-output amplifier for amplifying an input signal to output a differential signal and a reference voltage generation circuit for generating a reference voltage from at least one of signals that constitute a differential output of the amplifier;
    first and second filter circuits for removing a frequency component lower than that of the input signal, the first and second filter circuits being connected to the differential output of the amplifier;
    an amplitude detection circuit connected to outputs of the first and second filter circuits; and
    a comparator for comparing an output signal of the amplitude detection circuit with a predetermined reference voltage.

7. The amplifier circuit of claim 6, wherein
    the amplifier circuit has a multi-stage structure including a plurality of said main amplification sections which are cascade-connected; and
    the amplifier circuit further includes first and second switches for selecting any of the plurality of main amplification sections to connect a differential output of the amplifier of the selected main amplification section to the first and second filter circuits.

8. The amplifier circuit of claim 6, wherein each of the first and second filter circuits is a high pass filter.

9. The amplifier circuit of claim 6, wherein each of the first and second filter circuits is a band pass filter.

10. The amplifier circuit of claim 6, wherein each of the first and second filter circuits has the function of changing a signal band through which a signal is allowed to pass.

11. The amplifier circuit of claim 10, wherein a resistance value and a capacitance value of each of the first and second filter circuits are adjustable by switching connections of resistors and capacitors included in the filter circuit.

12. An amplifier circuit, comprising:
    a main amplification section which includes an amplifier for amplifying an input signal and a reference voltage generation circuit for generating a reference voltage from an output of the amplifier;
    a filter circuit for removing a frequency component lower than that of the input signal, the filter circuit being connected to an output of the amplifier;
    an amplitude detection circuit connected to an output of the filter circuit; and
    a comparator for comparing an output signal of the amplitude detection circuit with a predetermined reference voltage,
    wherein the filter circuit has the function of changing a signal band through which a signal is allowed to pass.

13. The amplifier circuit of claim 12, wherein a resistance value and a capacitance value of the filter circuit are adjustable by switching connections of resistors and capacitors included in the filter circuit.

14. The amplifier circuit of claim 12, wherein:
    the amplifier circuit has a multi-stage structure including a plurality of said main amplification sections which are cascade-connected; and
    the amplifier circuit further includes a switch for selecting any of outputs of amplifiers of the plurality of main amplification sections to connect the selected output to the filter circuit.

15. The amplifier circuit of claim 12, wherein the filter circuit is a high pass filter.

16. The amplifier circuit of claim 12, wherein the filter circuit is a band pass filter.

* * * * *

UNITED STATES PATENT AND TRADEMARK OFFICE
CERTIFICATE OF CORRECTION

| | |
|---|---|
| PATENT NO. | : 7,046,092 B2 |
| APPLICATION NO. | : 10/861463 |
| DATED | : May 16, 2006 |
| INVENTOR(S) | : Noriaki Takeda |

It is certified that error appears in the above-identified patent and that said Letters Patent is hereby corrected as shown below:

On the title page:

Under item "(56) References Cited", add:

-- FOREIGN PATENT DOCUMENTS

JP   5-191354  7/1993
   JP  10-112689  4/1998

OTHER DOCUMENTS

Makoto NAKAMURA, et al., "An Instantaneous Response CMOS Optical Receiver IC with Wide Dynamic Range and Extremely High Sensitivity Using Feed-Forward Auto-Bias Adjustment", IEEE Journal of Solid-State Circuits, Vol. 30, No. 9, pp. 991-997, September 1995 --

Signed and Sealed this

Twenty-seventh Day of March, 2007

JON W. DUDAS
*Director of the United States Patent and Trademark Office*